United States Patent
McFadden et al.

(10) Patent No.: US 12,359,306 B2
(45) Date of Patent: Jul. 15, 2025

(54) DEPOSITION PROCESSING SYSTEMS HAVING ACTIVE TEMPERATURE CONTROL AND ASSOCIATED METHODS

(71) Applicant: Technetics Group LLC, Charlotte, NC (US)

(72) Inventors: Angus McFadden, Santa Clara, CA (US); Jason Wright, Santa Clara, CA (US)

(73) Assignee: TECHNETICS GROUP LLC, Charlotte, NC (US)

( * ) Notice: Subject to any disclaimer, the term of this patent is extended or adjusted under 35 U.S.C. 154(b) by 533 days.

(21) Appl. No.: 17/722,137

(22) Filed: Apr. 15, 2022

(65) Prior Publication Data

US 2022/0259721 A1  Aug. 18, 2022

Related U.S. Application Data

(63) Continuation of application No. 16/222,894, filed on Dec. 17, 2018, now Pat. No. 11,332,821.
(Continued)

(51) Int. Cl.
C23C 14/54 (2006.01)
C23C 14/06 (2006.01)
(Continued)

(52) U.S. Cl.
CPC ........ *C23C 14/541* (2013.01); *C23C 14/0694* (2013.01); *C23C 14/083* (2013.01); *C23C 14/221* (2013.01); *C23C 14/505* (2013.01)

(58) Field of Classification Search
None
See application file for complete search history.

(56) References Cited

U.S. PATENT DOCUMENTS 5,607,009 A   3/1997  Turner et al.
5,653,806 A * 8/1997  Van Buskirk ..... C23C 16/45565
                                              118/724
(Continued)

FOREIGN PATENT DOCUMENTS

EP   0406669 A2  1/1991
JP   H0327522 A  2/1991
(Continued)

OTHER PUBLICATIONS

EP Application No. 18891939.3, Extended European Search Report mailed Aug. 26, 2021, 5 pgs. total.
(Continued)

*Primary Examiner* — Jethro M. Pence
(74) *Attorney, Agent, or Firm* — Husch Blackwell LLP

(57) ABSTRACT

Several embodiments of the present technology are directed to actively controlling a temperature of a substrate in a chamber during manufacturing of a material or thin film. In some embodiments, the method can include cooling or heating the substrate to have a temperature within a target range, depositing a material over a surface of the substrate, and controlling the temperature of the substrate while the material is being deposited. In some embodiments, controlling the temperature of the substrate can include removing thermal energy from the substrate by directing a fluid over the substrate to maintain the temperature of the substrate within a target range throughout the deposition process.

12 Claims, 4 Drawing Sheets

Related U.S. Application Data

(60) Provisional application No. 62/608,182, filed on Dec. 20, 2017.

(51) Int. Cl.
*C23C 14/08* (2006.01)
*C23C 14/22* (2006.01)
*C23C 14/50* (2006.01)

(56) References Cited

U.S. PATENT DOCUMENTS

| | | | |
|---|---|---|---|
| 6,492,625 B1 | 12/2002 | Boguslavskiy et al. | |
| 7,972,444 B2 * | 7/2011 | Zucker | C23C 16/4586 |
| | | | 118/724 |
| 9,062,379 B1 * | 6/2015 | Riker | H01J 37/32651 |
| 9,543,219 B2 | 1/2017 | Adderly et al. | |
| 10,257,887 B2 * | 4/2019 | Matyushkin | H01L 21/67248 |
| 2001/0025783 A1 * | 10/2001 | Sundarrajan | C23C 14/541 |
| | | | 204/192.15 |
| 2002/0127852 A1 * | 9/2002 | Kawakami | C23C 16/54 |
| | | | 438/689 |
| 2003/0029610 A1 | 2/2003 | Moslehi | |
| 2006/0027169 A1 * | 2/2006 | Tsukamoto | C23C 16/46 |
| | | | 118/724 |
| 2006/0075969 A1 | 4/2006 | Fischer | |
| 2006/0274474 A1 | 12/2006 | Lee et al. | |
| 2007/0029642 A1 | 2/2007 | Inagawa et al. | |
| 2007/0227877 A1 * | 10/2007 | Wang | H01L 28/55 |
| | | | 204/192.1 |
| 2008/0241778 A1 * | 10/2008 | Kulp | H01L 21/67109 |
| | | | 432/5 |
| 2008/0271471 A1 | 11/2008 | Nozawa et al. | |
| 2009/0114158 A1 | 5/2009 | Zucker et al. | |
| 2010/0175831 A1 | 7/2010 | Sasaki | |
| 2013/0171744 A1 * | 7/2013 | Kang | H01L 22/10 |
| | | | 438/795 |
| 2013/0334038 A1 | 12/2013 | Riker et al. | |
| 2015/0311044 A1 | 10/2015 | Sun et al. | |
| 2015/0371847 A1 * | 12/2015 | Cheng | C23C 14/0641 |
| | | | 204/192.25 |
| 2016/0326625 A1 | 11/2016 | Sun et al. | |
| 2018/0374724 A1 * | 12/2018 | Parkhe | H01L 21/6831 |
| 2019/0185989 A1 | 6/2019 | McFadden et al. | |
| 2020/0385851 A1 * | 12/2020 | Lerner | C23C 14/08 |
| 2021/0022212 A1 * | 1/2021 | Cimino | H01L 21/67063 |
| 2021/0132575 A1 * | 5/2021 | Yamamoto | H01L 21/67248 |
| 2022/0243332 A1 * | 8/2022 | Chandrasekharan | |
| | | | H01L 21/67109 |

FOREIGN PATENT DOCUMENTS

| | | |
|---|---|---|
| JP | 2004079349 A | 3/2004 |
| JP | 2007016272 A | 1/2007 |
| JP | 2007322156 A | 12/2007 |

OTHER PUBLICATIONS

International Search Report and Written Opinion for PCT/US2018/066066 dated Mar. 11, 2019.

Parylene Thermal Properties: How Temperature Extremes Affect Parylene. https://vsiparylene.com/2018/01/23/parylene-thermal-properties-how-temperature-extremes-affect-parylene/. VSI parylene. (Year: 2019).

* cited by examiner

DEPOSITION PROCESSING SYSTEMS HAVING ACTIVE TEMPERATURE CONTROL AND ASSOCIATED METHODS

CROSS-REFERENCE TO RELATED PATENT APPLICATIONS

The present application is a continuation of U.S. patent application Ser. No. 16/222,894 filed Dec. 17, 2018, which claims priority to U.S. Provisional Patent Application No. 62/608,182 filed Dec. 20, 2017, which application is incorporated herein by reference in its entirety.

TECHNICAL FIELD

The present disclosure relates to deposition processing systems having active temperature control, and more particularly relates to managing thermal stress of deposition materials with active temperature control of chamber components and associated systems.

BACKGROUND

Process chambers suitable for use in depositing materials on various surfaces are well known in the art. In one specific example, process chambers are used in semiconductor processing systems. A process chamber of a semiconductor processing system can include, e.g., electrostatic chucks (ESCs), chamber shielding, showerheads and similarly situated chamber components that are used to form semiconductor materials (e.g., thin films). During operation, the individual components can be exposed to and eroded by extreme environments resulting from corrosive plasmas conditions. Erosion resistant coatings are often used to protect chamber components exposed to such conditions. The high temperatures developed during operation and coefficient of thermal expansion (CTE) mismatch between, e.g., the ESC and the thin film deposited thereon, results in slight deformation. For example, during the development of thin film coatings, material is deposited over an ESC, and thermal energy associated with the deposited material can rapidly heat the ESC and other chamber components. Given the different thermal masses of each chamber component, the thermal energy associated with the deposited material can create CTE mismatch within the chamber that results in warping and deformations.

FIGS. 1A and 1B are schematic cross-sectional views of a chamber component 20 (e.g., a fixed substrate or ESC) and a workpiece 30 (e.g., semiconductor material, insulation material, thin film, etc.) in accordance with the prior art, and are meant to illustrate the effects of CTE mismatch. FIG. 1A illustrates the component 20 and workpiece 30 after they have warped into a concave shape, and FIG. 1B illustrates the component 20 and workpiece 30 after they have warped into a convex shape. More specifically, FIGS. 1A and 1B illustrate that a concave or convex shape assumed by the component 20 can result in defects that can subsequently be translated to the workpiece 30 formed thereon.

One method conventionally used to mitigate the issue with CTE mismatch has been to cover the chamber components with a thermal coating (e.g., a plasma spray) to protect them from the harsh environments of the process chamber. Over time, however, the thermal coatings themselves can still be subject to CTE mismatch (and/or thermal non-uniformity) and can cause particle generation and lower productions yields that result from deformations, delamination, and contamination of the thin films. The issue of particle generation (and contamination) has become an ever more prevalent issue because of the continued need for semiconductor component geometries to get smaller. Accordingly, there exists a need for other approaches to limit CTE mismatch of components within a chamber.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, there is a need to control CTE mismatch of components within a deposition processing system. Accordingly, several embodiments of the systems in accordance with the present technology include a heating/cooling mechanism for supplying thermal energy to or removing thermal energy from a component or substrate (e.g., a fixed substrate or a movable substrate) within a chamber. Based on temperature measurements taken of the substrate, as well as temperature measurements of the chamber and/or the deposition of material, the mechanism can be used to adjust temperature of the substrate to be maintained within a target range. In some embodiments, the mechanism can also be used to adjust temperature of the substrate to approach that of the deposition of material. In each of these embodiments, a CTE of the substrate and a CTE difference between the substrate and other chamber components (e.g., thin films) can be controlled. As such, the present technology provides the ability to increase production yields of materials by, for example, reducing deformations and contamination of thin films.

Figure 1A:
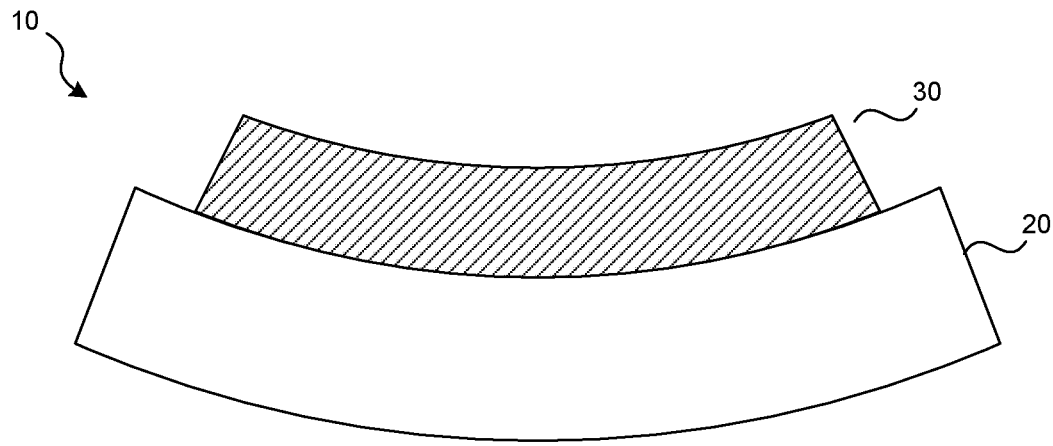
FIGS. 1A and 1B are schematic cross-sectional views of chamber components of a deposition processing system in accordance with the prior art.
Figure 1B:
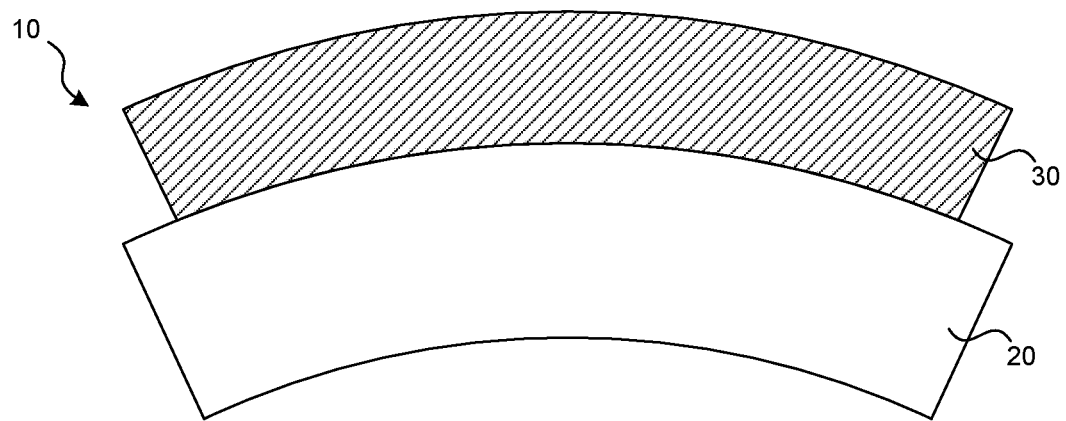
Figure 2:
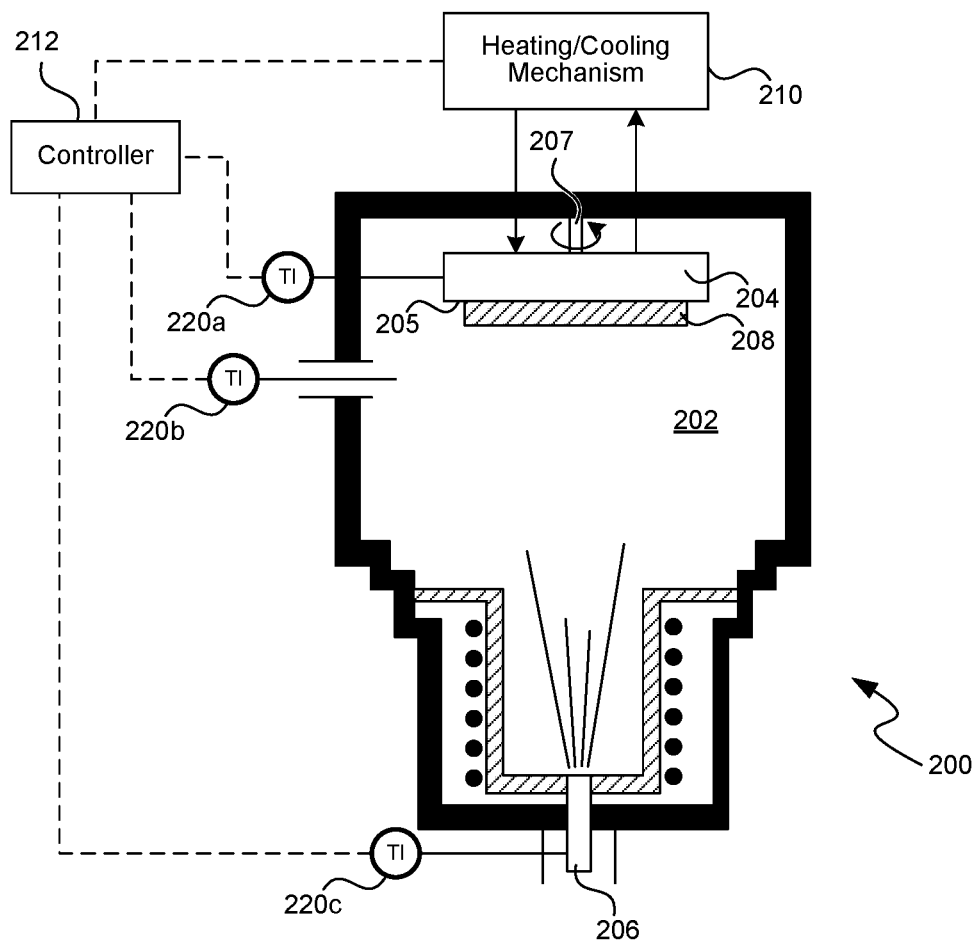
FIG. 2 is a schematic view of a semiconductor system in accordance with embodiments of the present technology.

FIG. 2 is a schematic view of a deposition processing system 200 ("system 200"). The system 200 includes a chamber 202, a substrate 204, a deposition mechanism 206 for depositing a deposition material 208 over the substrate 204, a heating and/or cooling mechanism 210, and a controller 212 operably coupled to the mechanism 210. The chamber 202 can operate under a vacuum and between temperatures ranging from approximately −30° C. to approximately 300° C. The substrate 204 can include an electrostatic chuck (ESC) formed from materials including thin ceramics, and can have a thickness greater than 5 mm or ranging from approximately 1 mm or less. The substrate 204 can be mechanically coupled to a housing of the chamber 202 via a rotatable support 207. The rotatable support can be operable to rotate and adjust the substrate 204

(and material 208 thereon) to effect an angle of incidence for which material is deposited onto the substrate 204. The substrate 204 includes a generally flat outer surface 205 to support the deposition material 208 disposed thereon. The deposition mechanism 206 can include multiple devices commonly used to deposit thin films, such as an evaporative source material and an ion source. The deposition mechanism 206 is capable of performing physical vapor deposition (PVD), thermal evaporation, electron beam evaporation, ion beam sputtering, and cathodic arcs, amongst other deposition techniques commonly used or known in the relevant art. The deposition mechanism 206 can also include ion beam assisted deposition (IBAD) systems which combine a source of vapor flux with an ion-beam source. The deposition material 208 can include yttrium oxide ($Y_2O_3$), yttrium fluoride ($YF_3$), and/or yttrium oxyfluoride (YOF), as well as other insulating or semiconductor materials typically used or known in the relevant art.

The system 200 can further include multiple temperature measurement devices 220 (e.g., thermocouples, resistance temperature detector (RTDs), optical pyrometers, etc.), including a first temperature measurement device 220a to measure a temperature of the substrate 204, a second temperature measurement device 220b to measure a temperature inside the chamber 202, and a third temperature measurement device 220c to measure a temperature of the deposition device 206. The third temperature measurement device 220c can correspond to, for example, the temperature at which material is being deposited into the chamber 202 or onto the substrate 204. In some embodiments, the temperature at which material is being deposited may be calculated based on a combination of multiple thermocouples, such as the second and third temperature measurement devices 220b-c. For example, the calculated temperature at which material is being deposited may be a weighted average that is between measurements of the second and third temperature measurement devices 220b-c. As explained in further detail below in reference to the description of the controller 212, the temperature at which material is being deposited may be used to determine the temperature that the substrate 204 is adjusted to. Each of the temperature measurement devices 220a-c is operationally coupled to and can serve as an input to the controller 212. A person of ordinary skill in the art will understand that each of the temperature measurement devices 220a-c can correspond to multiple thermocouples (e.g., for redundancy purposes).

The heating/cooling mechanism 210 can include one or more heat exchanging devices configured to (a) heat the substrate to a target temperature via heating elements, infrared lamps, or other means known in the relevant art, and/or (b) provide fluid to cool (e.g., remove thermal energy from) the substrate 204 and then receive the fluid (e.g., having the removed thermal energy) from the substrate 204. The fluid provided to the substrate 204 can be cooled via convective means (e.g., cooling fans), chillers, coolants, and other methods known in the relevant art. Alternatively, the fluid can also be provided to heat (e.g., add thermal energy to) the substrate 204. In some embodiments, the substrate 204 includes one or more channels through which the fluid can flow to remove thermal energy from the substrate 204. In other embodiments, the fluid can flow through channels of a plate material that is in direct contact with the substrate 204, such that the fluid cools the plate material, which then cools the substrate 204 via conduction. In some embodiments, the channels passing through the plate or substrate 204 can include (a) multiple sections corresponding to different areas of the substrate 204 and the surface of the substrate 204, and (b) one or more valves operable to control flow of the fluid through the different sections. In such an embodiment, flow of the fluid through the plate or fixed substrate may be based on a target temperature for each individual section. For example, it may be beneficial for the component to have a first section at a first temperature and a second section at a second temperature higher than the first temperature, in order to adjust thermal stress associated with different sections of the film.

The mechanism 210 can be configured to control a temperature of the substrate 204 (or a section of the substrate 204) within a target range. For example, in some embodiments, the mechanism 210 can adjust the temperature of the substrate 204 to be within a range of approximately −30° C. to approximately 300° C., approximately −10° C. to approximately 180° C., or approximately 20° C. to approximately 150° C. In some embodiments, the target range may be based on the material 208 being deposited over the substrate 204, and the desired qualities of the end product. For example, the target range may be plus or minus 10° C. of a deposition temperature that corresponds to a particular thermal stress of the material 208. In some embodiments, the target range may be based on the substrate 204 itself (e.g., the ceramic material of the substrate) to ensure the outer surface 205 upon which the material 208 is deposited is and remains generally flat during the deposition process.

The controller 212 (e.g., a control system) is used in part to control the heating/cooling mechanism 210 and thereby control the temperature of the substrate 204. In operation, the controller 212 receives inputs (e.g., measurements from the temperature measurement devices 220a-c and target set point temperature and/or range) to affect operation of the heating/cooling mechanism 210 and obtain a desired temperature of the substrate 204 within a target range. More specifically, depending on the target temperature, the controller 212 can control, for example, the amount of fluid directed to the substrate 204 (or the plate) and/or operation of the valves operable to control the flow of the fluid. The controller 212 can operate according to a closed feedback loop system using proportional-integral-derivative (PID) control. Many embodiments of the controller 212 may take the form of computer-executable instructions, including routines executed by a programmable computer. The controller 212 may, for example, also include a combination of supervisory control and data acquisition (SCADA) systems, distributed control systems (DCS), programmable logic controllers (PLC), control devices, and processors configured to process computer-executable instructions. Those skilled in the relevant art will appreciate that the technology can be practiced on computer systems generally known in the relevant art. The technology can be embodied in a special-purpose computer or data processor that is specifically programmed, configured or constructed to perform one or more of the computer-executable instructions described below. Accordingly, the terms "controller" as generally used herein can refer to any data processor.

One benefit of the present technology is the ability to actively control the temperature and the rate of temperature change of the substrate. As such, unlike conventional methods which are prone to thermal stresses due to CTE mismatch between a substrate and deposited material, the present technology provides the ability to control (e.g., limit or exaggerate) any such stress by actively cooling or heating the substrate to be within a target temperature range. Another benefit of the present technology is the ability to vary the temperature of the substrate, as well as the rate of change of the temperature, independently of the other components. As such, in operation, the present technology can allow the substrate to heat up at a slower rate to ensure, for example, there is less or no deformation of the outer surface of the substrate during the initial heat up process. Yet another benefit of the technology is the ability to control CTE mismatch between the substrate and material deposited thereon by only altering one variable (i.e., the temperature of the substrate). For example, since the temperature of the substrate can be adjusted independent of other variables associated with the chamber (e.g., the chamber temperature, the deposition material, the deposition temperature, etc.), an operator does not need to change operations associated with the other aspects of deposition.

Figure 3:
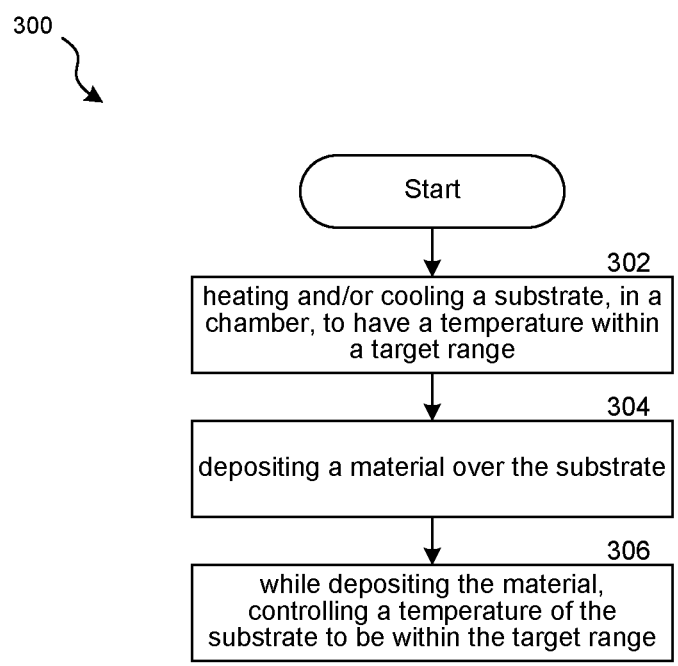
FIG. 3 is a flow diagram illustrating a process in accordance with embodiments of the present technology.

FIG. 3 is a flow diagram illustrating a process 300 in accordance with embodiments of the present technology. The process 300 generally relates to controlling temperature of a fixed component (e.g., substrate 204) within a chamber (e.g., chamber 202) of a deposition processing system (e.g., system 200). Process portion 302 includes heating and/or cooling the substrate to have a temperature with a target range. As previously mentioned, heating the substrate may be done by heating elements, infrared lamps, and/or other means known in the relevant art. The heating step may be used prior to deposition to raise the temperature of the substrate to a temperature within a target range at which deposition is expected to occur. For example, if deposition is expect to occur within a temperature range of 120° C. to 150° C., the substrate may be heated to a temperature within this range prior to deposition. Cooling the substrate may be done by directing fluid from a cooling mechanism (e.g., mechanism 210) to the substrate and removing heat via the fluid, as previously described with reference to FIG. 2. In some embodiments, the cooling step may be done after heating the substrate, after deposition has initially begun, and/or throughout the deposition process. In other embodiments, the cooling step may be done after a first film has been deposited and before a second film is deposited. In yet other embodiments, the cooling step may be done between the deposition of a first layer and a second layer of the same film (e.g., material 208) to control mechanical characteristics of the material or resulting thin film. A benefit of heating and/or cooling the substrate prior to deposition of a material is the ability to control (e.g., limit) the rate of temperature increase or decrease to ensure deformation of the substrate caused by CTE does not occur. Another benefit of heating and/or cooling the substrate before deposition is that, once deposition begins, the substrate does not experience a rapid temperature increase that results from the deposition. Again, this can help ensure mechanical damage to the substrate caused by CTE does not occur.

Process portion 304 includes depositing a material over a surface of the substrate. In a preferred embodiment, deposition of the material on the substrate occurs after the substrate has been cooled or heated to have a temperature within the target range. Depositing the material can be done using any of the deposition methods previously described with reference to FIG. 2, or other deposition methods known or used in the relevant art.

Process portion 306 includes controlling a temperature of the substrate to be within the target range. Depositing the material on the substrate will innately include adding thermal energy (e.g., heat) to the substrate. As such, in order to maintain the substrate at a temperature within the target range, the system needs to remove the added heat as the material is being deposited. As previously disclosed with reference to FIG. 2, heat may be removed from the substrate by moving fluid toward the substrate and absorb heat being added by the deposition process. Control of the temperature can be controlled using a controller (e.g., controller 212) to monitor and maintain the temperature within the target range. As such, the process 300 may operate according to a control loop feedback mechanism (e.g., PID control) that iteratively performs the operations outlined above.

Figure 4:
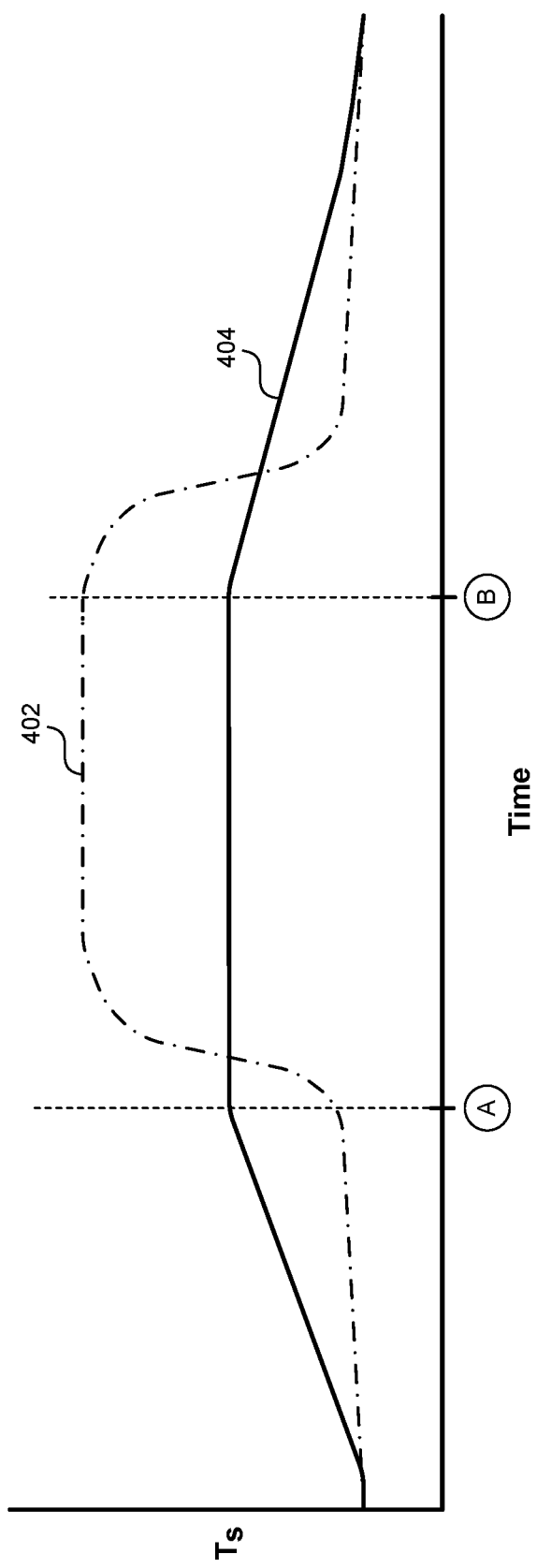
FIG. 4 is a plot illustrating a simulation of embodiments in accordance with embodiments of the present technology.

FIG. 4 is a plot 400 illustrating a simulation of multiple embodiments. The plot 400 includes a y-axis corresponding to a temperature, $T_S$, or the substrate, and an x-axis corresponding to time. The plot 400 further includes a first line 402 corresponding to a simulation in accordance with embodiments of the prior art, and a second line 404 corresponding to a simulation in accordance with embodiments of the present technology. As shown in FIG. 4, plot 400 further includes a first plane (A) corresponding to a time at which deposition of material begins and a second plane (B) corresponding to a time at which deposition of material ends. Referring first to line 402, configured in accordance with an embodiment of the prior art, the temperature profile of the substrate begins at room temperature and increases at a first rate before reaching an equilibrium temperature. The equilibrium temperature is maintained until deposition is complete or ceases at plane (B), at which point $T_S$ drops back to approach room temperature. As shown by line 402, the temperature of the substrate can experience a rapid increase in temperature associated with the heat added to the chamber via deposition, and a rapid decrease in temperature associated with the cease of heat being added via deposition. As such, the substrate can be especially prone to thermal stresses during these time periods. The stresses can be translated to the material being deposited thereon and can result in particle contamination, delamination, and deformation, amongst other issues.

Referring next to line 404, configured in accordance with embodiments of the present technology, the temperature profile of the substrate includes a steady rise up to a deposition temperature at plane (A), at which point deposition begins. As material is being deposited onto the substrate, the temperature profile of the substrate remains generally steady until deposition is complete or ceases at plane (B). Thereafter, the temperature decrease of line 404 is controlled so as to produce a steady return to room temperature.

As shown by the comparison of lines 402 and 404, the present technology exhibits a number of advantages over conventional techniques. For example, unlike conventional techniques with can include rapid temperature increases during the early stages of deposition and rapid temperature decreases after the final stage of deposition, the corresponding stages of deposition for the present technology are controlled and less extreme. As such, the present technology decreases the likelihood of production loss resulting from contamination, delamination, and deformation.

Another benefit of the present technology is the ability to perform the entire deposition of the thin film at a generally uniform temperature (e.g., within a range of 10° C.). As shown in line 402, approximately one third of the deposition takes place before the substrate reaches its equilibrium temperature. In contrast to line 402, the deposition of line 404 takes place at approximately a uniform temperature, thereby resulting in a film having more uniform characteristics. This benefit of the present technology can be even more significant at the onset of deposition, which can be a notable period of a coating process. The onset of deposition is when the interface between coating and substrate is established and can significantly affect adhesion and other mechanical properties. The ability to maintain a controlled and/or uniform temperature during the onset of deposition will result in films with more uniform characteristics, as well as improved adhesion and mechanical toughness.

Yet another benefit of the present technology is the ability to control deposition temperature at a preferred temperature having a target CTE value. As shown in FIG. 4, the temperature of the substrate during deposition for line 402 is at a higher temperature than that of line 404, meant to embody an optimal temperature that limits CTE mismatch. As shown in Equation 1, the thermal stress, $\sigma_{FILM}$, associated with CTE for a film is due in part to a combination of an intrinsic stress, $\sigma_{INT}$, associated with the film and a CTE stress, $\sigma_{CTE}$, associated with deposition of the film. For film applications, such as those in accordance with the present technology, the intrinsic stress can be based in part on the deposition method (e.g., IBAD, CVD, sputtering, evaporation, cathodic arc, etc.). The CTE stress can be based on a difference between the deposition temperature and the service temperature of a substrate. More specifically, as shown by Equation 2, CTE stress is based on the modulus of elasticity of the film, $E_{FILM}$, Poisson's Ratio of the film, $v_{FILM}$, a differential CTE constant, $\Delta\alpha = \alpha_{FILM} - \alpha_{SUBSTRATE}$, and a temperature change of the film, $\Delta T$. In some embodiments, $\Delta T$ corresponds to the temperature difference between the deposition temperature and temperature of the base substrate.

$$\sigma_{FILM} = \sigma_{INT} + \sigma_{CTE} \qquad \text{Equation 1}$$

$$\sigma_{CTE} = \left(\frac{E_{FILM}}{1 - v_{FILM}}\right)\Delta\alpha(\Delta T) \qquad \text{Equation 2}$$

As such, decreasing any difference between the temperature at which film material is deposited and the temperature of the substrate can decrease overall thermal stress of the film.

Yet another benefit of the present technology is the ability to independently control (a) temperature of the substrate and CTE mismatch, and (b) ion energy associated with each film. Stated otherwise, the present technology allows manufacturers of thin films to control film stress by altering one or both of the intrinsic stress and the CTE stress. As previously mentioned, the intrinsic stress can be based on the deposition method (e.g., IBAD, CVD, sputtering, evaporation, cathodic arc, etc.) used to deposit the film on the substrate. Each deposition method has different levels of ion energy associated therewith, thereby resulting in different levels of intrinsic stress that the film will have. For example, films deposited using evaporation methods may have low ion energy, resulting in a lower density of particles and more voids within the film, and thereby leading to more tensile stresses. As another example, films deposited using a cathodic arc deposition method may have high ion energy, resulting in a higher density of particles and less voids, and thereby leading to more compressive stresses. Tensile, compressive, and other stresses can have advantages and disadvantages depending on the application the film is being used for. For example, a higher stress may be beneficial to improve a film's mechanical toughness properties, such as abrasion or erosion resistance. Going further, it may be desirable for only certain layers (e.g., the outer layer) to have the mechanical toughness characteristics. Accordingly, the present technology provides multiples variables that can be adjusted to obtain a particular stress. For example, a user can adjust the temperature of the substrate, ion-beam energy, flux, species of chamber gas (e.g., argon, boron, nitrogen, etc.), the angle of incidence, chamber pressure, duty cycle, substrate rotation and other characteristics, all of which can increase or decrease a film's thermal stresses. Additionally, since these variables can be adjusted independent of one another, the temperature of the substrate and deposition method can be used in combination to exaggerate or minimize the effect of thermal stress. For example, at the onset of deposition, the ion-beam energy can be increased to promote adhesion through ballistic mixing at the coating/substrate interface. As another example, the ion-beam characteristics can be modulated to create a multi-layered film structure with alternating high stress and low stress layers that inhibit defect propagation and reduce particle generation.

As alluded to above, the deposition processing systems having active temperature control described herein are well suited for use in semiconductor processing systems. However, the deposition processing systems described herein can be used in many other contexts and are not limited to use in semiconductor processing systems. Generally speaking, the deposition processing systems described herein can be used in any context where material deposition on a surface is required. For example, the deposition systems described herein are suitable for use in flat panel manufacturing systems where material deposition on a surface is required.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising," "including," and "having" are used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A deposition processing system, comprising
a chamber;
a substrate;
a support coupled to the chamber to support the substrate within the chamber;
a deposition mechanism to deposit a material onto the substrate;
at least one of a heater, a cooler, or a combined heater and cooler thermally coupled to the substrate;
at least a first temperature measurement device to measure a substrate temperature;
at least a second temperature measurement device to measure a material temperature, wherein the material is the material deposited on the substrate; and
a controller to receive temperature data from at least the first temperature measurement device and the second temperature measurement device to control the temperature of the substrate based on the material temperature using at least one of the heater, the cooler, or the combined heater and cooler.

2. The deposition system of claim 1 wherein the at least one of the heater, the cooler, or the combined heater and cooler thermally coupled to the substrate comprises at least a channel formed in the substrate holder and whereby the controller controls a fluid flowing through the channel to control the substrate temperature.

3. The deposition system of claim 2 wherein the at least one of the heater, the cooler, or the combined heater and cooler is a cooler and the fluid removes thermal energy from the substrate.

4. The deposition system of claim 2 wherein the at least one of the heater, the cooler, or the combined heater and cooler is a heater and the fluid adds thermal energy to the substrate.

5. The deposition system of claim 4 wherein the at least one of the heater, the cooler, or the combined heater and cooler comprises is at least one heating element.

6. The deposition system of claim 4 wherein the heater, the cooler, or the heater or the combined heater and cooler comprises at least one heat lamp.

7. The deposition system of claim 1 wherein the support is a rotating support.

8. The deposition system of claim 1 comprising at least a third temperature measurement device that measures a chamber temperature.

9. The deposition system of claim 8 wherein the controller controls the substrate temperature based on the chamber temperature.

10. The deposition system of claim 1 wherein the controller controls the substrate temperature to minimize thermal stress based on the coefficient of thermal expansion (CTE) mismatch between the substrate and the material being deposited on the substrate.

11. The deposition system of claim 10 wherein the controller controls the substrate temperature to be within a target range.

12. The deposition system of claim 1 wherein the controller controls the substrate temperature prior to depositing material on the substrate to limit a rate of temperature change such that the substrate does not deform.

* * * * *